(12) United States Patent
Park et al.

(10) Patent No.: US 9,299,758 B2
(45) Date of Patent: Mar. 29, 2016

(54) DUAL DISPLAY DEVICE WITH VERTICAL STRUCTURE

(71) Applicant: Electronics and Telecommunications Research Institute, Daejeon (KR)

(72) Inventors: Sang Hee Park, Daejeon (KR); Chi Sun Hwang, Daejeon (KR)

(73) Assignee: ELECTRONICS AND TELECOMMUNICATIONS RESEARCH INSTITUTE, Daejeon (KR)

(*) Notice: Subject to any disclaimer, the term of this patent is extended or adjusted under 35 U.S.C. 154(b) by 101 days.

(21) Appl. No.: 13/960,413

(22) Filed: Aug. 6, 2013

(65) Prior Publication Data

US 2014/0042475 A1 Feb. 13, 2014

(30) Foreign Application Priority Data

Aug. 7, 2012 (KR) .................. 10-2012-0086241

(51) Int. Cl.
*H01L 27/32* (2006.01)
*H01L 51/52* (2006.01)
*G02F 1/1335* (2006.01)

(52) U.S. Cl.
CPC ...... *H01L 27/3267* (2013.01); *G02F 1/133553* (2013.01); *H01L 51/5271* (2013.01); *G02F 2001/133626* (2013.01)

(58) Field of Classification Search
CPC .. H05B 33/22; H05B 33/24; G02F 1/133555; G02F 1/1362; G09G 3/3648; G09G 3/3225; G09G 2300/0852; G09G 2300/0465; G09G 2300/023; G09G 3/3208; G09G 2300/046; H01L 27/12; H01L 51/0541
See application file for complete search history.

(56) References Cited

U.S. PATENT DOCUMENTS

| | | | | |
|---|---|---|---|---|
| 2003/0053016 A1* | 3/2003 | Kubota et al. | | 349/113 |
| 2003/0103021 A1* | 6/2003 | Young et al. | | 345/76 |
| 2004/0164292 A1 | 8/2004 | Tung et al. | | |
| 2005/0219235 A1* | 10/2005 | Fukuo | | 345/204 |
| 2007/0032000 A1* | 2/2007 | Yeh et al. | | 438/149 |
| 2007/0075935 A1 | 4/2007 | Mesmer et al. | | |
| 2008/0084360 A1* | 4/2008 | Shingai | | 345/1.3 |
| 2008/0142819 A1* | 6/2008 | Liu et al. | | 257/89 |
| 2008/0252825 A1* | 10/2008 | Kim et al. | | 349/96 |

(Continued)

FOREIGN PATENT DOCUMENTS

KR 10-2012-0017672 A 2/2012

OTHER PUBLICATIONS

Sheng-Hung Lin et al., "P-179: A Novel Pixel Structure for the Emiflective Hybrid Display System", SID Symposium Digest of Technical Papers, Jun. 2006, pp. 902-904, vol. 37, No. 1.

*Primary Examiner* — Jae Lee
*Assistant Examiner* — Mohammed R Alam
(74) *Attorney, Agent, or Firm* — Rabin & Berdo, P.C.

(57) ABSTRACT

Disclosed is a dual display device having a vertical structure, in which a reflective display device and a self-emissive display device are formed on one substrate in a vertical structure so as to enable a reflective display or a self-emissive display according to a situation and provide a high resolution display. The dual display device having a vertical structure includes: a thin film transistor formed on a substrate; a white light emitting device formed on the thin film transistor: a reflection adjusting layer formed on the white light emitting device; and a color converting layer formed on the reflection adjusting layer.

13 Claims, 3 Drawing Sheets

(56) References Cited

U.S. PATENT DOCUMENTS

| | | | |
|---|---|---|---|
| 2009/0079922 A1* | 3/2009 | Tanaka | 349/123 |
| 2009/0231662 A1* | 9/2009 | Sorensson | G02F 1/15 359/273 |
| 2011/0216257 A1* | 9/2011 | Galstian et al. | 349/33 |
| 2011/0303940 A1* | 12/2011 | Lee et al. | 257/98 |
| 2012/0274883 A1* | 11/2012 | Lee et al. | 349/104 |
| 2013/0328945 A1* | 12/2013 | Kim | H01L 33/08 345/690 |
| 2013/0335801 A1* | 12/2013 | Verger | G02F 1/155 359/266 |

* cited by examiner

DUAL DISPLAY DEVICE WITH VERTICAL STRUCTURE

CROSS-REFERENCE TO RELATED APPLICATIONS

This application is based on and claims priority from Korean Patent Application No. 10-2012-0086241, filed on Aug. 7, 2012, with the Korean Intellectual Property Office, the disclosure of which is incorporated herein in its entirety by reference.

TECHNICAL FIELD

The present disclosure relates to a dual display device with a vertical structure, and more particularly, to a dual display device having a vertical structure, in which a reflective display device and a self-emissive display device are formed on one substrate in a vertical structure so as to enable a reflective display or a self-emissive display according to a situation and provide a high resolution display.

BACKGROUND

A large flat panel display has been widely used for an advertisement, as well as a home TV, according to development of a technology thereof, and has been gradually extended to a field of an outdoor display. When a transmissive display such as a TFT-LCD or a self-emissive display such as an active matrix organic light emitting diode (AMOLED) is used as a display for outdoor in the bright sunny daytime, it is not easy to represent luminance in itself for maintaining appropriate visibility, and even though it is possible, there is a serious problem in that power consumption increases due to high luminance and thus life is shortened. A reflective display configured to perform a display by using external light may be a realistic alternative, but has a disadvantage in that the reflective display cannot be used when the external light is weak.

Accordingly, a display having a function of a transmissive/self-emissive device and a function of a reflective device has been developed so as to use a display day and night, and a representative example thereof is a transflective LCD.

FIG. 1 is the most representative transflective LCD having a structure in which a transmissive display and a reflective display horizontally occupy one pixel half and half. Since a backlight of the transflective LCD is basically turned on all the time, it is not helpful in reducing energy and also an image quality is not excellent, so that the transflective LCD was eventually failed to be commercialized.

In order to solve a problem regarding energy saving and achieve excellent image quality regardless of a degree of peripheral brightness, a display capable of freely switching a reflective mode and an emissive mode needs to be implemented.

In the meantime, the AMOLED has been developed to enter a large TV market following the success of the mass production of a small and medium mobile display, and the AMOLED has noticeably more potential as a core display mode of a next generation transparent flexible display. Accordingly, there is a high possibility that a dual mode display, which uses the AMOLED or a self-emissive device such as an LED and a QD when a place is indoor or sun light is weak, and switches to a reflective mode in an outdoor place having strong sun light, will have competitive marketability in the medium to longer term.

SUMMARY

The present disclosure has been made in an effort to provide a new reflective display device having a simple structure.

The present disclosure has been made in an effort to provide a dual display device capable of resolving a problem of resolution deterioration by forming a device capable of a self-emissive display and a reflective display within one pixel in a vertical structure by combining a reflective device having a new structure and an emissive device, such as an AMOLED device or a quantum dot.

The present disclosure has been made in an effort to a dual mode display capable reducing power consumption of a display by switching between a reflective mode and an emissive mode according to an environment.

The present disclosure has been made in an effort to a dual mode display capable of maintaining resolution of a display by integrating a reflective device and an emissive device on one substrate in a vertical structure.

An exemplary embodiment of the present disclosure provides a dual display device having a vertical structure, including: a thin film transistor formed on a substrate; a white light emitting device (OLED, LED and QD) formed on the thin film transistor; a reflection adjusting layer formed on the light emitting device; and a color converting layer formed on the reflection adjusting layer.

The reflection adjusting layer may change reflectivity by association with an output signal of the thin film transistor.

The reflection adjusting layer may be driven in a passive matrix type so that the reflection adjusting layer is driven by an electric signal applied between upper and lower electrodes.

When the reflection adjusting layer is switched to a self-emissive mode, the reflection adjusting layer may not perform a reflectivity adjusting function associated with an output signal of the thin film transistor, but may be maintained in a state of low reflectivity and high transmittance.

The reflection adjusting layer may apply a voltage in a range of 0 V to 50 V to change the reflectivity in a range of 0% to 99%.

The reflection adjusting layer may include at least one layer.

The reflection adjusting layer may be formed of a nano material, and the nano material may have any one form among a nano particle, a nano wire and a nano rod.

The nano material may include silicon (Si).

The reflectivity may be adjusted according to an amount of lithium entering and coming out from the nano particle by applying a voltage to the nano material.

The reflection adjusting layer may include an electrochromic material.

The color converting layer may be formed of a color filter or a quantum dot device.

The quantum dot device may be formed of a composite including the quantum dot device and one or more types of auxiliary materials.

The white light emitting device may be a white organic light emitting diode (OLED), an inorganic LED or a Q-LED.

A white light from the white light emitting device may be converted into a red color light, a green color light and a blue color light through the color converting layer.

According to the exemplary embodiments of the present disclosure, it is possible to perform function of a reflective light display device and a self-emissive display device with a simple device structure.

According to the exemplary embodiments of the present disclosure, it is possible to implement a device on one substrate to avoid troublesomeness of laminating two displays.

According to the exemplary embodiments of the present disclosure, it is possible to manufacture a high-resolution display by integrating a reflective display device and an emissive display device in a vertical structure.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

Figure 1:
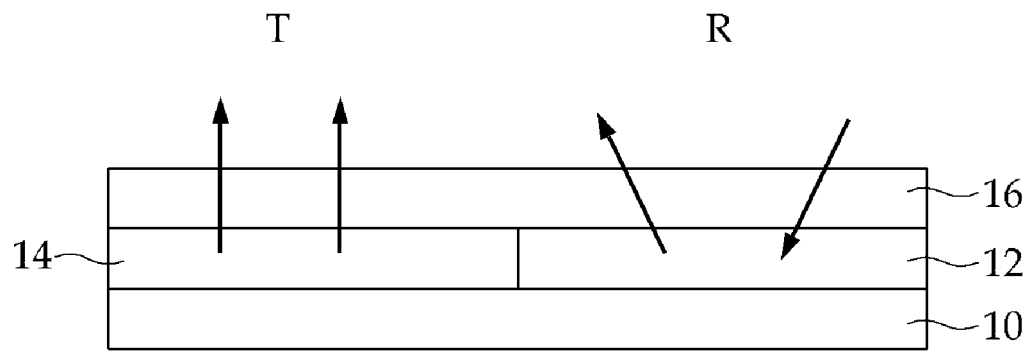
FIG. 1 is a diagram illustrating a structure of a transflective display device in the related art.
Figure 2:
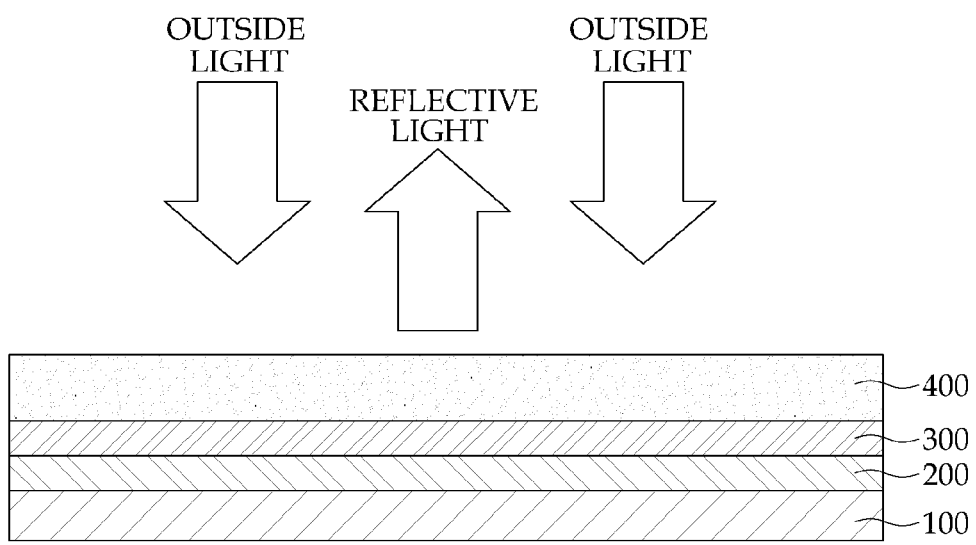
FIG. 2 is a diagram illustrating a structure of a reflective display device according to an exemplary embodiment of the present disclosure.

FIG. 2 is a diagram illustrating a structure of a reflective display device according to an exemplary embodiment of the present disclosure.

As illustrated in FIG. 2, the reflective display device according to the exemplary embodiment of the present disclosure includes a substrate 100, a driving device layer (backplane) 200 including a thin film transistor (TFT), a capacitor, and the like, a reflection adjusting layer 300 and a color converting layer 400.

Outside light incident from an outside is reflected on a surface of the reflection adjusting layer 300 and is emitted back as reflective light, and a color of the reflective light is converted to a red color, a green color and a blue color by the color converting layer 400.

In an actual display device, one pixel is configured by combining sub pixels, such as a red sub pixel, a green sub pixel, a blue sub pixel and a white sub pixel. For reference, in a case of the white sub pixel, the color converting layer 400 is not required.

The driving device layer (backplane) 200 including the thin film transistor (TFT), the capacitor, and the like serves to drive the reflective display device, and changes luminance of each of the reflective light, such as red light, green light, blue light and white light, by adjusting a degree of reflection of the reflection adjusting layer 300 to enable display contents to be displayed.

Figure 3:
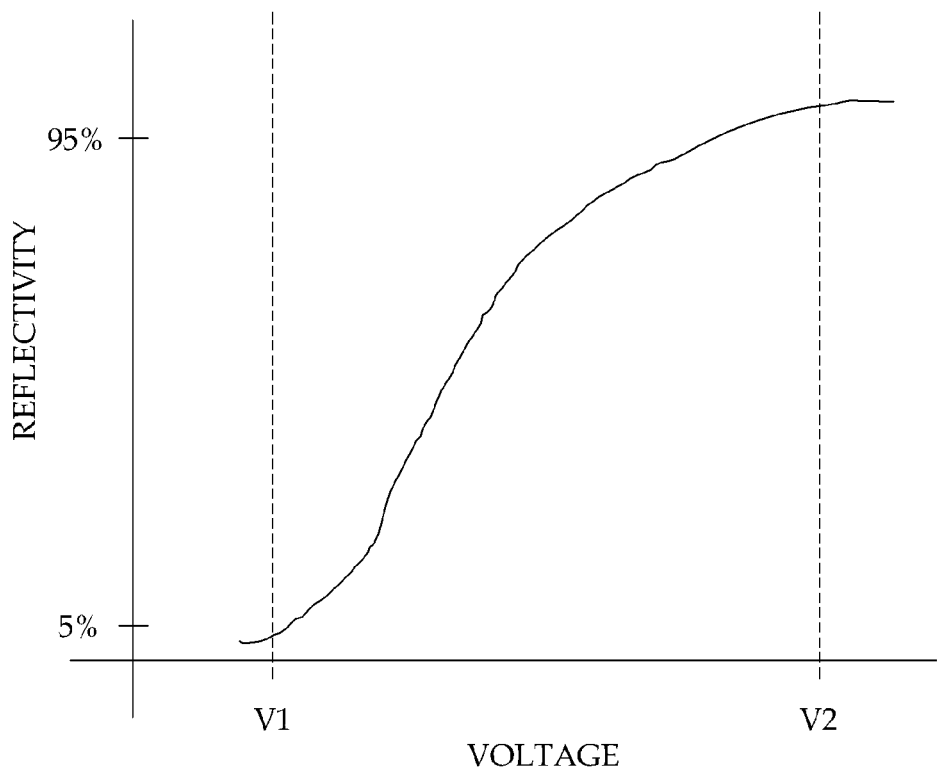
FIG. 3 is a graph illustrating a reflection characteristic of a reflection adjusting layer applied to the display device according to an exemplary embodiment of the present disclosure.

FIG. 3, which is an exemplary diagram illustrating a reflection characteristic of the reflection adjusting layer 300, and represents that reflectivity increases from 5% to 95% according to an increase in a voltage applied to the reflective display device from V1 to V2 or according to a change in a quantity of a current.

FIG. 3 simply illustrates one example, and in order to change the reflectivity in a range of 0% to 99%, a voltage in a range of 0 V to 50 V may be applied, and the reflectivity may be changed by changing the current or other variables, other than the voltage.

The reflection adjusting layer 300 is formed of a nano material. The nano material includes a nano particle that is a particle having a size in a nano level, a long nano wire having an inconsistent growth direction and having a size in a nano level, and a nano rod that is a straightly extending rod having a size in a nano level.

The reflectivity of the reflection adjusting layer 300 may be adjusted, for example, by applying a voltage so that lithium enters and comes out from the nano particle, the nano wire and the nano rod formed of silicon (Si) or a complex thereof.

A material having an electrochromic characteristic may be used as one of the materials of the reflection adjusting layer 300, and in this case, the nano material may also be utilized. Especially, when the electrochromic material is used, Ag or Pd may be used.

Here, electrochromism is a phenomenon in which a color is reversibly changed by a direction of an electric field when a voltage is applied, and an electrochromic device is a device in which a color is reversibly changed by application of a voltage from an outside by using the electrochromism principle. Since the electrochromic device uses absorption of natural light, different from a currently released emissive display, the electrochromic device has a characteristic in that the eyes are not bothered, dependency on a visible angle is little, a memory characteristic is exhibited, and power consumption is little.

The outside light that is not reflected on the reflection adjusting layer 300 is scattered, absorbed, and conducted in an unspecific direction. A part of the scattered light may decrease a contrast ratio of the reflective display, but a degree of the decrease of the contrast ratio is insignificant considering the luminance of the reflective light.

The light absorbed in the reflection adjusting layer 300 is converted into heat. The reflection adjusting layer 300 may include a material having a good thermal conductivity characteristic so that the converted heat can be easily discharged to the outside. The reflection adjusting layer 300 may be formed of a single layer or multiple layers.

The color converting layer 400 is formed of a color filter or a quantum dot (QD).

The color converting layer 400 may be formed of a layer formed of a QD composite including corresponding quantum dots, instead of the respective quantum dots implementing a red color, a green color and a blue color.

The QD composite is a composite formed of a QD device and one or more types of auxiliary materials. Here, the auxiliary material performs a protection function so as to extend a driving life of the QD. The auxiliary material may perform a function of optically helping the outside light to be incident on the color converting layer 400 and the reflective light to leave from the color converting layer 400. An example of the auxiliary material includes moisture or an oxygen absorbent.

Figure 4:
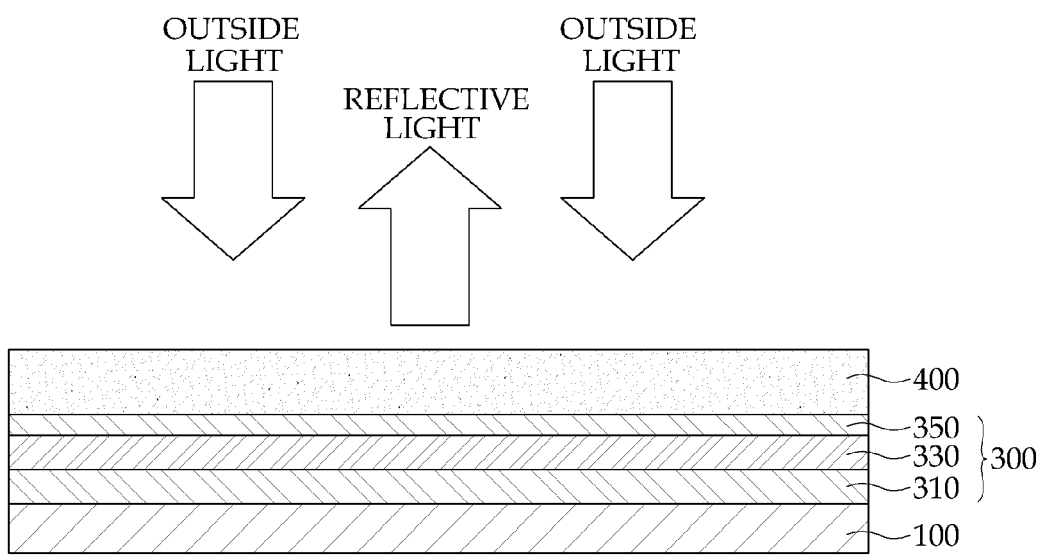
FIG. 4 is a diagram illustrating a structure of a reflective display device of a passive matrix (PM) type according to an exemplary embodiment of the present disclosure.

FIG. 4 is a diagram illustrating a structure of a reflective display device of a passive matrix (PM) type according to an exemplary embodiment of the present disclosure.

The passive matrix type is a type in which a pixel is formed at an intersection point of two electrodes which are orthogonal to each other, and thus each pixel point is driven by two overlapping electrode terminals. The passive matrix type means a type in which a designated operation is performed only when a driver applies a signal. That is, when the driver does not apply the signal, the display device returns to an original state, such as an initial state. In general, super twisted nematic (STN), color-STN (CSTN) and passive matrix organic light emitting diodes (PAMOLED) belong to the passive matrix type. Since the passive matrix driving type does not include an active matrix device (TFT, capacitance, and the like), a panel may be easily implemented compared to the active matrix driving type.

As illustrated in FIG. 4, the reflective display device of the passive matrix (PM) type includes the substrate 100, the reflection adjusting layer 300 and the color converting layer 400, but does not include the thin film transistor (TFT) 200 that is an active matrix device. The reflective display device of the passive matrix type can adjust the reflection by simply driving the electrodes 310 and 350 within the reflection adjusting layer 300. That is, the reflective display device of the passive matrix type can adjust the reflection so that reflectivity increases when a high voltage is applied to the electrodes 310 and 350 within the reflection adjusting layer 300, and reflectivity decreases when a low voltage is applied to the electrodes 310 and 350 within the reflection adjusting layer 300.

Figure 5:
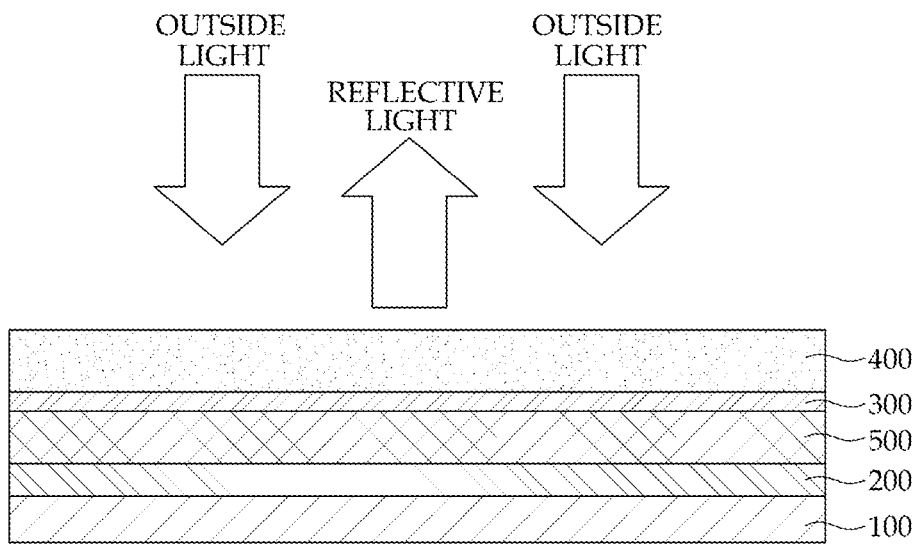
FIG. 5 is a diagram illustrating a structure of a dual display device having a vertical structure according to an exemplary embodiment of the present disclosure.
Figure 5:
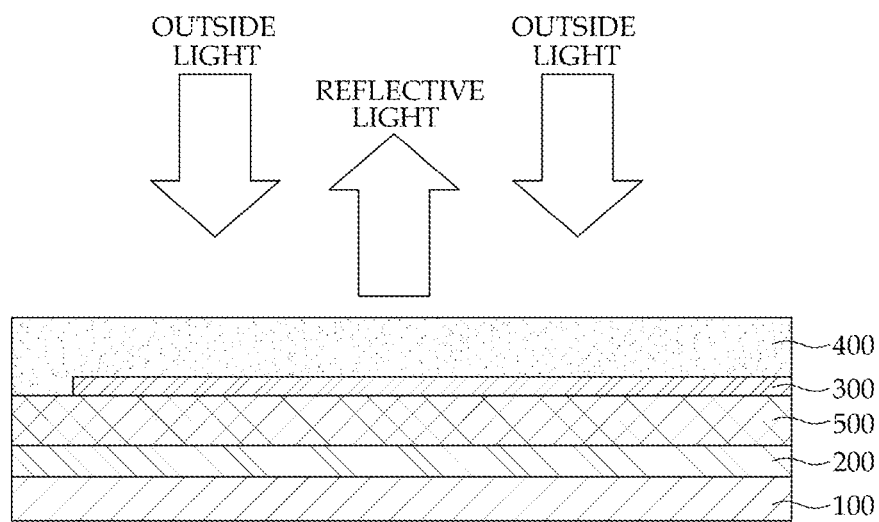

FIG. 5 is a diagram illustrating a structure of a dual display device having a vertical structure according to an exemplary embodiment of the present disclosure.

As illustrated in FIG. 5-A, a dual display device having a vertical structure according to an exemplary embodiment of the present disclosure has a structure including a reflective device having the substrate 100, the thin film transistor (TFT) 200, the reflection adjusting layer 300 and the color converting layer 400, and a white organic light emitting device 500 between the thin film transistor (TFT) 200 and the reflection adjusting layer 300. That is, the dual display device having the vertical structure has a structure in which the reflective display device is vertically combined with a white light emitting device (a white OLED, a white LED and a white QD) that is a self-emissive device.

When the dual display device having the vertical structure is driven in the reflective mode, the thin film transistor (TFT) 200 is driven to adjust reflectivity in the reflection adjusting layer 300.

In the meantime, when the dual display device having the vertical structure is switched to the self-emissive mode, the reflection adjusting layer 300 does not perform the reflectivity adjusting function associated with the thin film transistor (TFT) 200 any more, but us maintained in a state of low reflectivity and high transmittance. In order to improve the transmittance in the self-emissive mode, the reflection adjusting layer 300 may not be formed in a partial region on the white organic light emitting device 500 (see FIG. 5-B), and a white light of the white organic light emitting device 500 is converted into a red color light, a green color light and a blue color light through the color converting layer 400.

As described above, by forming the reflective device and the emissive device of the present disclosure on one substrate in a vertical structure, it is possible to manufacture a high-resolution dual display device capable of switching between the reflective mode and the self-emissive mode.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A dual display device having a vertical structure, comprising:
    a thin film transistor formed on a substrate;
    a white light emitting device formed on the thin film transistor;
    a reflection adjusting layer formed directly on the white light emitting device, and partially covering the white light emitting device, the reflection adjusting layer being a single layer formed of an electrochromic material or a nano material; and
    a color converting layer formed on the reflection adjusting layer.

2. The dual display device of claim 1, wherein the reflection adjusting layer changes reflectivity by association with an output signal of the thin film transistor.

3. The dual display device of claim 1, wherein the reflection adjusting layer is driven in a passive matrix type so that the reflection adjusting layer is driven by an electric signal applied between upper and lower electrodes.

4. The dual display device of claim 2, wherein when the reflection adjusting layer is switched to a self-emissive mode, the reflection adjusting layer does not perform a reflectivity adjusting function associated with an output signal of the thin film transistor, but is maintained in a state of low reflectivity and high transmittance.

5. The dual display device of claim 4, wherein a voltage in a range of 0 V to 50 V is applied to the reflection adjusting layer to change the reflectivity in a range of 0% to 99%.

6. The dual display device of claim 4, wherein the nano material has any one form of a nano particle, a nano wire and a nano rod.

7. The dual display device of claim 6, wherein the nano material includes silicon (Si).

8. The dual display device of claim 6, wherein the reflectivity is adjusted according to an amount of lithium entering and coming out from the nano particle by applying a voltage to the nano material.

9. The dual display device of claim 1, wherein the color converting layer is formed of a color filter or a quantum dot device.

10. The dual display device of claim 9, wherein the quantum dot device is formed of a composite including the quantum dot device and one or more types of auxiliary materials.

11. The dual display device of claim 1, wherein the white light emitting device is an organic white light emitting diode (OLED), an inorganic LED or a Q-LED.

12. The dual display device of claim 1, wherein a white light from the white light emitting device is converted into a red color light, a green color light and a blue color light through the color converting layer.

13. The dual display device of claim 1, wherein the reflection adjusting layer includes a thermal conductive material for discharging heat converted from light absorbed by the reflection adjusting layer.

* * * * *